United States Patent
MacDonald et al.

(10) Patent No.: US 7,166,488 B2
(45) Date of Patent: Jan. 23, 2007

(54) METAL MEMS DEVICES AND METHODS OF MAKING SAME

(75) Inventors: Noel C. MacDonald, Santa Barbara, CA (US); Marco F. Aimi, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 19 days.

(21) Appl. No.: 10/823,559

(22) Filed: Apr. 14, 2004

(65) Prior Publication Data

US 2004/0207074 A1 Oct. 21, 2004

Related U.S. Application Data

(60) Provisional application No. 60/463,052, filed on Apr. 16, 2003.

(51) Int. Cl.
*H01L 21/00* (2006.01)
(52) U.S. Cl. ............... 438/52; 438/53; 257/E21.218
(58) Field of Classification Search ............. 438/50, 438/52, 53, 666, 702, 749–750, 745, 739; 257/E21.218
See application file for complete search history.

(56) References Cited

U.S. PATENT DOCUMENTS

| | | | |
|---|---|---|---|
| 3,791,852 A * | 2/1974 | Bunshah | 427/567 |
| 4,767,666 A * | 8/1988 | Bunshah et al. | 428/334 |
| 4,923,716 A * | 5/1990 | Brown et al. | 427/249.15 |
| 5,010,035 A * | 4/1991 | Bunshah et al. | 117/88 |
| 5,198,390 A | 3/1993 | MacDonald et al. | |
| 5,316,979 A | 5/1994 | MacDonald et al. | |
| 5,393,375 A * | 2/1995 | MacDonald et al. | 216/2 |
| 5,399,415 A | 3/1995 | Chen et al. | |
| 5,426,070 A | 6/1995 | Shaw et al. | |
| 5,628,917 A | 5/1997 | MacDonald et al. | |
| 5,846,849 A | 12/1998 | Shaw et al. | |
| 5,847,454 A * | 12/1998 | Shaw et al. | 257/734 |
| 6,180,536 B1 | 1/2001 | Chong et al. | |
| 6,768,628 B2 * | 7/2004 | Harris et al. | 361/277 |
| 6,780,672 B2 * | 8/2004 | Steele et al. | 438/107 |
| 6,881,369 B2 * | 4/2005 | Lee et al. | 264/219 |
| 6,887,732 B2 * | 5/2005 | Gopal et al. | 438/50 |
| 6,902,656 B2 * | 6/2005 | Ouellet et al. | 204/192.16 |
| 2002/0041441 A1 * | 4/2002 | Wang | 359/599 |

\* cited by examiner

*Primary Examiner*—Thao X. Le
(74) *Attorney, Agent, or Firm*—Gates & Cooper LLP

(57) ABSTRACT

Metal MEMS structures are fabricated from metal substrates, preferably titanium, utilizing micromachining processes with a new deep etching procedure to provide released microelectromechanical devices. The deep etch procedure includes metal anisotropic reactive ion etching utilizing repetitive alternating steps of etching and side wall protection. Variations in the timing of the etching and protecting steps produces walls of different roughness and taper. The metal wafers can be macomachined before forming the MEMS structures, and the resulting wafers can be stacked and bonded in packages.

14 Claims, 8 Drawing Sheets

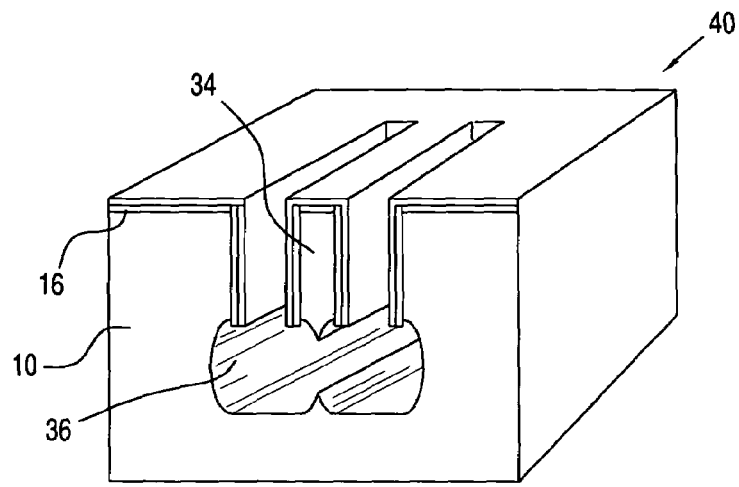
FIG.2
FIG.3a
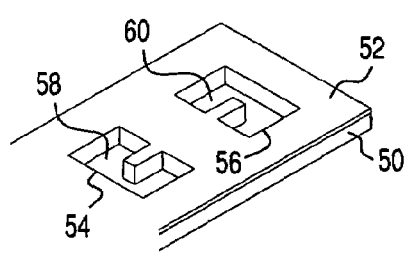
FIG.3b
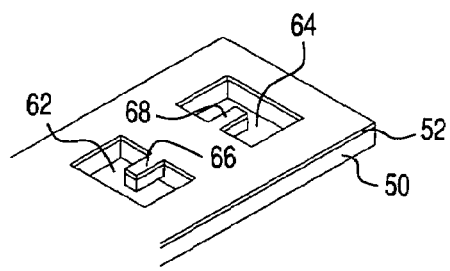
FIG.3c
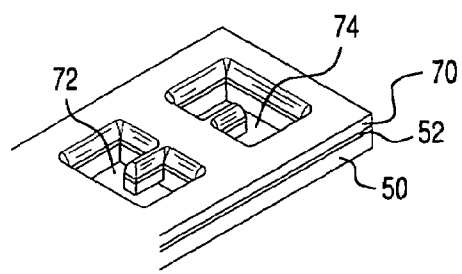
FIG.3d
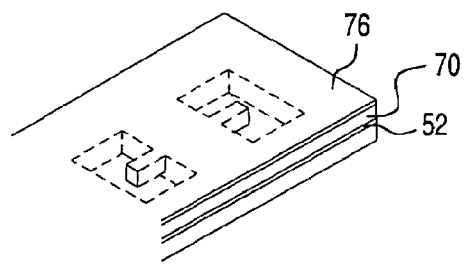

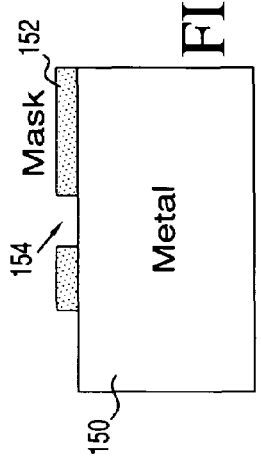
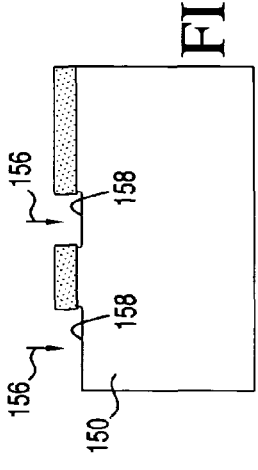
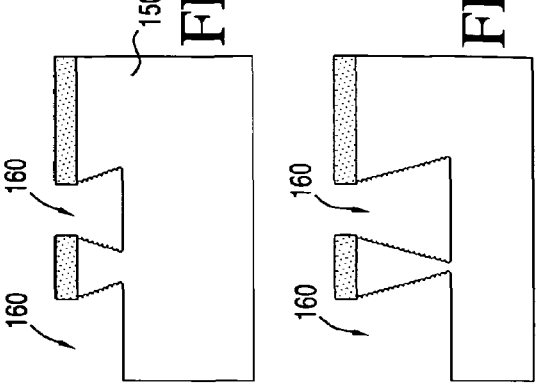
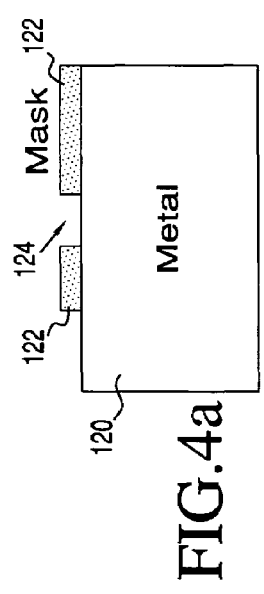
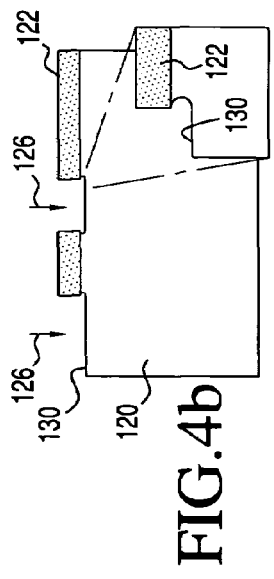
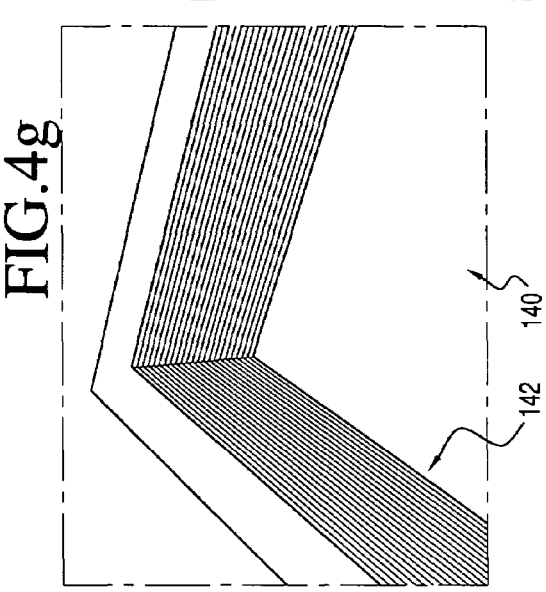
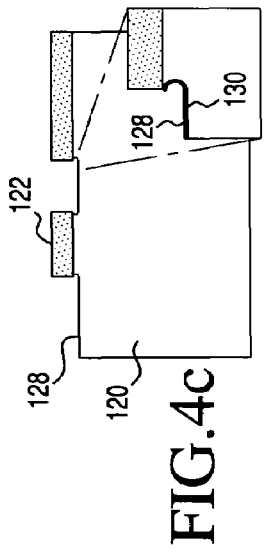
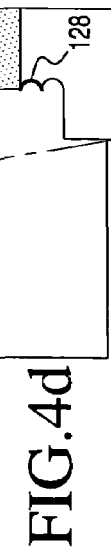

METAL MEMS DEVICES AND METHODS OF MAKING SAME

This application claims the benefit of U.S. Provisional Application No. 60/463,052, filed Apr. 16, 2003, the disclosure of which is hereby incorporated herein by reference.

FIELD OF THE INVENTION

The present invention relates, in general, to macro, micro and nano machining of micro devices out of metal substrates of bulk titanium or other suitable metal, to processes for macro/micro machining of microelectromechanical and nanoelectromechanical devices from metal wafers or foils, and to devices made by such processes.

BACKGROUND OF THE INVENTION

In the past, bulk MicroElectroMechanical systems and devices or NanoElectroMechanical systems or devices, which will hereinafter be collectively referred to as MEMS devices, systems or processes, have mostly been made out of semiconductor substrate materials in the form of wafers of single crystal silicon or polysilicon thin films on various substrates through the use of conventional semiconductor production equipment and processes. This technology is described with respect to its application to single crystal silicon substrates in U.S. Pat. No. 5,316,979, for example, the disclosure of which is hereby incorporated herein by reference. This process is often referred to as the "SCREAM" process, is well developed, and has found wide application in a variety of fields. However, semiconductor MEMS devices produced in this manner are brittle, having a fracture toughness between 0.1–3 MPa m$^{1/2}$, and there has been only a limited ability to select suitable materials based on the intended applications. As a result, the physical characteristics of the materials limit their use.

SUMMARY OF THE INVENTION

Silicon has been the common material of choice for MEMS devices because of the vast infrastructure that is in place for bulk silicon micro machining and the integration of electronics. An object of the current invention is to apply this silicon infrastructure to an alternative material; in other words, to allow for material selection in the area of bulk micro machined devices. Accordingly, the present invention expands the technology of semiconductor micro machining to metal substrates such as bulk titanium, stainless steel, and other metal substrates. The use of metal substrates offers unique opportunities to address many new micro-sensor, medical, and other MEMS applications, as well as providing MEMS packaging that is particularly advantageous in harsh environments. Both macro and micro machining may be carried out on the same substrate in accordance with this new approach to fabricating MEMS.

The preferred metal, in accordance with this invention, is titanium, and the invention includes process steps where titanium MEMS structures or surfaces can be converted to titanium carbide (TiC), titanium boride (TiB) and/or titanium nitride (TiN), using ion implantation. The titanium carbide, titanium boride and titanium nitride MEMS devices can be used for high temperature applications or for applications where surface hardness or wear is of importance, such as in nano-scale probes, RF relays for portable communication and Radar Systems, or in MEMS devices that require rubbing surfaces, as in probes or micro tools.

The new, unique approach to the fabrication of MEMS devices, in accordance with the invention, is the provision of pre-machined metal substrates or wafers wherein standard machine shop tools and processes are used as the starting point for micro-machining. Such wafers can, for example, have milled and drilled features that would be very expensive or impossible to produce using conventional semiconductor micro-processing tools and processes. In addition, such pre-machined wafers can include regions which are milled or diamond sawed to create membranes and grooves or channels. Such grooves or channels can be used to delineate individual dies (chips) on a wafer and can then be used to separate them at the completion of the semiconductor-like micro-machining process used to fabricate the MEMS devices on the individual chips. Pre-machined grooves can also be used for making thin membrane structures in which micro-machined sensors, actuators and microstructures can be fabricated.

The use of metal wafers allows full access to the available metal machining infrastructure, including milling, drilling and metal polishing of starting wafers, while also allowing the use of macro-machining and micro/nano-machining processes such as the SCREAM process previously used for semiconductors to provide new opportunities to make unique macro/micro/nano metal MEMS devices.

The similarities between the metal MEMS process of the present invention and the SCREAM process discussed above allow the design considerations currently in use for the SCREAM process to be applied to the metal MEMS process. In addition, devices already designed for the SCREAM process can be duplicated in the metal MEMS process, creating the same device functionality but with the devices being made out of titanium or titanium-based materials having flat surfaces. These devices include, but are not limited to, wire arrays, fluid channels, microscale parts, sensors, heaters, etc. The similarities between these two processes will also decrease the design time required to create unique metal MEMS devices.

An advantage of the present invention is that the cost of metal wafers is nominally 10 to 100 times less expensive, in volume production, than the cost of single crystal silicon wafers. Another advantage is that metals like titanium have unique properties that are advantageous for applications such as sensors and other devices used in high temperature, medical, biological, chemical and other hazardous or harsh environments. In addition, the size of a metal wafer is not restricted to the size of a silicon wafer; titanium substrates of a square meter in area can be patterned and micro-machined with presently available production equipment used to produce large area plasma and liquid crystal displays. Titanium can also be deformed into 3-D shapes, such as rolling a thin foil carrying MEMS devices into a cylinder.

An example of a two-step macro-machining/micro-machining process in accordance with the invention is as follows. In this example, it is assumed that a 0.5 mm thick substrate is to support each MEMS device, with a 200 mm diameter wafer supporting 100 separate MEMS devices (chips). Each MEMS chip is to include a 50 µm (micrometer) thick, 2 mm×2 mm membrane in the center of the chip.

The membrane for each chip is made, in this example, by milling 100 square cavities, each 2 mm×2 mm, from the backside of the wafer, each cavity being milled to a depth to produce a membrane 50 µm thick for each chip. In a similar manner channels, or kerfs, are milled on the periphery of each chip to define the chips and to facilitate chip separation after the micro/nano-MEMS processing. The next steps include microlithography, patterning and etching microscale MEMS in the thin membrane areas, using the very expensive conventional semiconductor processing tools and processes with a particular etch material to perform the micro/nano-scale machining of the substrate to create MEMS sensors and actuators, or other MEMS microstructures, in those areas.

In a second example, a 1 mm thick wafer to package MEMS and semiconductor chips may be produced utilizing a 200 mm diameter metal wafer to support 100 separate chips. A cavity 15 mm×15 mm by 0.6 mm deep is fabricated in the center of each chip by milling the wafer as described above to produce 100 chips with cavities. In a similar manner, channels are milled on the periphery of each chip to facilitate metal chip separation; thereafter MEMS processing steps are used to fabricate MEMS devices in the membranes.

In a third example, Ti MEMS devices are fabricated in macromachined shallow cavities of about 50 to 100 micrometers in thickness. Again, the expensive semiconductor MEMS processing steps, including micro-lithography, patterning, etching and releasing, are used with a particular etch material to produce micro-scale MEMS sensors and actuators, or other MEMS microstructures, inside the cavities. The wafers are bonded and the packaged chips are separated by cutting through the pre-machined grooves, or kerfs. Many more combinations of wafer-scale, macro/micro machining and packaging are possible with titanium and other metal-based MEMS.

In a fourth example, a thin foil about 10 to 100 micrometers in thickness can be boned onto a thick substrate having previously machined holes. The semiconductor MEMS processing steps can be carried out on the foil before or after bonding to the substrate. The bonding can include gold thermal compression bonding, diffusion bonding, and/or welding through laser or electrical discharge.

Metals offer drastically different material properties than those provided by silicon, allowing metal MEMS to have improved functionality over previously created bulk semiconductor MEMS devices. Using metal wafers also allows preprocessing of the wafers into desired shapes using conventional metal working methods; this approach is not possible using semiconductor materials. As discussed above, a preferred material for use in fabricating MEMS devices is titanium, for it has many different properties, such as superior fracture toughness (~50 MPa $m^{1/2}$), when compared to single crystal silicon (~0.8 MPa $m^{1/2}$), which provide many opportunities to create devices that could not be realized in silicon.

Not only does titanium have the potential for creating novel devices, but the possibility of converting titanium to titanium carbide, titanium nitride, and titanium boride, as through plasma immersion, ion implantation, or angled ion implantation, provides the opportunity to create devices with even more exciting properties. These additional material properties give titanium a competitive advantage over many devices created in silicon. Some of these advantages are, but are not limited to, temperature resistance, radiation resistance, shock resistance, bio-compatibility, chemical robustness, high resistivity, and the size of the MEMS device. The unique physical and chemical properties of titanium give titanium MEMS the potential of improving and creating a class of new sensors, medical devices, surgical tools with sensors, and micro/nano tools with integrated packages.

An object of the present invention, then, is to provide semiconductor-like, or single crystal silicon MEMS-like, processes to make MEMS wafer-scale packages, MEMS robust relays and MEMS medical devices, sensors and tools from metal wafers, and more particularly from bulk titanium wafers. Through the use of a special etch recipe, bulk titanium can be deep etched just like bulk Single Crystal Silicon (SCS) using standard semiconductor processing equipment to produce high-aspect-ratio Ti MEMS. Titanium is a unique material that is used on many products that are subjected to harsh environments, including ships, aerospace vehicles, oil well drilling equipment, transportation, shipping, and chemical manufacturing. In addition, titanium and titanium alloys have broad acceptance for use in medical and biological applications, including hip replacements, dental implants, and packaging of implant devices, sensors and pacemakers, as well as macro/nano medical and surgical tools and needles. Thus, titanium is the material of choice for addressing harsh environments and for packaging in vivo biological sensors, monitors, and pumps. Ti MEMS, in addition, will provide a biologically compatible bulk Ti MEMS technology-base for in vivo sensors and 'biochips'.

Titanium wafers can also be used to make improved shock resistant and stable sensors, such as accelerometers, when integrated with titanium wafer-scale packaging, for a Ti-wafer scale package will have the same coefficient of thermal expansion as the Ti MEMS devices contained in the package. Such a Ti packaged Ti MEMS device exhibits better thermal stability than silicon MEMS devices mounted in packages which have substantially different coefficients of thermal expansion.

The relative shock performance of bulk titanium and single crystal silicon (SCS) wafers has been illustrated by a 'drop test' experiment where 150 millimeter diameter wafers of SCS and Ti are simultaneously dropped from a height of five feet onto a concrete floor. The brittle SCS wafers broke into numerous pieces while the Ti wafer survived the drop test with no breakage. Similar drop tests using smaller pieces of SCS and Ti produce similar results. Thus, Bulk Ti MEMS can address many shock sensitive, and environmentally sensitive, sensor and portable communication applications that are difficult achieve with silicon-based MEMS and standard chip packaging.

The present invention includes bulk Ti processing and process flow procedures; the integration of bulk titanium harsh environment MEMS in packages; and design, fabrication, wafer-scale packaging and device/package characterization. The Ti MEMS processes use commercial, production-grade 150 mm and 200 mm silicon-based processing equipment including ICP etchers, 248 nm lithography, and high energy ion implantation and immersion ion implantation tools to make TiC, TiN, and $TiB_2$ MEMS from Ti MEMS. The bulk titanium processes are compatible with integrated titanium-based harsh environment packages for titanium MEMS or Silicon MEMS with silicon CMOS, III-V electronics or other semiconductor chips mounted in the Ti package.

Unique components of the present invention include a new deep RIE process to achieve released Ti MEMS structures and devices. The Ti process also features high-aspect-ratio, through-the-wafer or through-the-Ti foil MEMS processing, and the integration of electrical and thermal isolation on the micrometer/nanometer scale. It further includes techniques to fabricate flat, polished, 8-inch (200 mm) diameter and 1 mm thick, bulk titanium wafers from sheets or rods of commercially available titanium and methods to make thick 200 mm diameter Ti wafers (1 mm–3 mm thick) for wafer-scale harsh environment MEMS packages.

Ion implantation and plasma immersion ion implantation processing techniques are used to form Titanium Carbide (TiC), Titanium Boride (TiB2) and Titanium Nitride (TiN)

MEMS from Bulk Titanium structures and MEMS by first fabricating bulk titanium MEMS and then converting the Ti MEMS to TiC, TiB$_2$ or TiN structures, or modifying the Ti MEMS surfaces, by ion implantation of C, B or N to produce very hard, high melting temperature MEMS structures or ion implant surfaces for wafer-scale titanium MEMS packages to improve package performance for selected applications. For example, TiN is a very hard, chemically inert, highly reflecting material or surface coating that can be used for optical, chemical, biological, or medical titanium MEMS packaging, and can be used to make very hard nano probes and small medical tools.

TiN or TiC surface coating technology is used for bulk Ti wafer-scale packages and larger Ti-based enclosures and packages for superior wear resistance. Such Bulk Ti harsh environment enclosures can be used in applications where the MEMS package is subjected to debris bombardment or when the package comes into contact with a moving surface for sensing. Thus, TiN or TiC coated harsh environment packages can better address applications where chemicals, fluid-friction (air, liquids etc.), sliding friction and wear may destroy standard MEMS packages.

The bulk Ti-MEMS process of the present invention includes, in one embodiment, a process for machining a metal substrate using patterning and deep metal etching to define and release metal structures. In accordance with this process, the released metal bars are covered with an insulating layer and a patterned conductor layer which forms the desired capacitive plates and conductors for the MEMS structure, with the metal bars acting as supports for the conductors and capacitors.

In a second embodiment, the released metal beams are supported by oxide supports or posts which electrically isolate the beams from the surrounding substrate. Electrical conductors are connected to the released beams so the beams act as the capacitive plates and conductors for the MEMS structure, without the need for oxide insulating layers.

In accordance with the invention, deep metal etching is carried out by a Metal Anisotropic Reactive Ion etching with Oxidation (MARIO) process, which allows formation of deep metal etching with substantially vertical walls or, if desired, with outwardly tapering sidewalls. In this process, the substrate is masked, and then is etched to produce a shallow cavity. The sidewalls and floors of the cavity are coated with a protective layer of oxide or a polymer, and the etching step is repeated to remove the protective layer on the cavity floor and to then continue the downward etching of the substrate to deepen the cavity. These steps are repeated to further deepen the cavity and to produce a trench having covered, scalloped, substantially vertical sidewalls and having the desired depth. By adjusting the timing of the steps in the repeated cycle, the scalloped surface of the wall can be made more or less rough, and can be downwardly and outwardly tapered, as desired. The trenches so formed may be patterned to define various MEMS structures.

Released beams and other structures fabricated in this manner from titanium can be treated, as by ion implantation or by converting the entire structure, to obtain desired physical characteristics. The MEMS structures formed in accordance with the invention can then be enclosed by metal covers to provide strong and reliable protection for the MEMS.

Robust, high reliability MEMS relays can be fabricated, in accordance with the invention, using bulk/surface TiN/Ti composites. The Ti MEMS process supports the fabrication of a suite of MEMS devices, including, for example, MEMS linear actuators and springs, MEMS torsion actuators and torsion springs, accelerometers, resonators, micro/nano tools and mechanical loading devices.

Large scale MEMS packages can be produced to allow large area distributed sensing; large area adaptive optics; large area optical sensor platforms; small phased-array radars; large area infrared imagers; and light collection/ power generation platforms for large area surfaces such as an aircraft wings and unmanned aerial vehicles.

BRIEF DESCRIPTION OF DRAWINGS

The foregoing, and additional objects, features and advantages of the invention will be more clearly understood from the following detailed description of preferred embodiments thereof, taken in conjunction with the accompanying drawings, in which:

FIG. 2 is a perspective view of the structure illustrated in FIG. 1(i);

FIGS. 3(a)–3(h) illustrate a process for isolation of metal through oxide deposition in accordance with a second embodiment of the invention;

FIGS. 4(a)–4(f) illustrate etch profiles for each cycle step for a straight side-wall etch;

FIG. 4(g) illustrates the wall of a cavity fabricated in accordance with the process of FIGS. 4(a)–4(f);

FIGS. 5(a)–5(d) illustrate etch profiles for each cycle step for an outwardly sloping side-wall etch;

DESCRIPTION OF PREFERRED EMBODIMENTS

In accordance with the invention, a process has been developed for fabricating MEMS devices from metal substrates, preferably single crystal or polycrystalline titanium, which is similar to the SCREAM process used for single crystal silicon described in U.S. Pat. No. 5,316,979. The process of the invention, which for convenience will be referred to as the Ti-MEMS process, is illustrated in cross-section in FIGS. 1(a) to 1(i), wherein a titanium release etch is achieved using a single lithography step, and wherein a titanium deep etch is achieved using a process which will be referred to herein as the "MARIO" process, to be described.

The Ti-MEMS process includes the ten following steps, which are illustrated in FIGS. 1(a)–1(i). In general, the titanium described in this process can be replaced with any metal, the silicon oxide described in the process can be replaced with any protective insulator, and the titanium oxide described can be replaced with any masking layer, but the process will be described for a titanium substrate using silicon oxide insulating and titanium oxide masking layers for convenience of description.

Figure 1A:
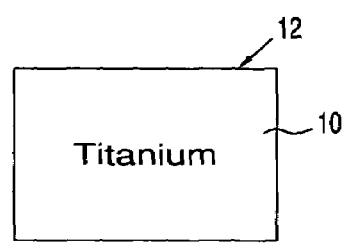
FIGS. 1(a)–1(i) diagrammatically illustrate a process for fabricating metal MEMS devices in accordance with a first embodiment of the present invention.

1. As illustrated in FIG. 1(a), a pure titanium wafer 10 is polished on its top surface 12 to a sub-micron to nanometer-scale finish. In one example, a 99.6% pure annealed titanium wafer 25 mm×25 mm square and 0.5 mm thick was polished to a sub-micron finish. The backside 14 of the wafer was then polished to reduce stress developed during the front side polish, to produce a double-sided polished Ti wafer.

Figure 1F:
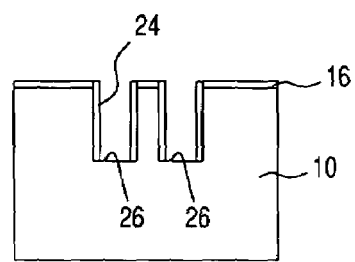
Figure 1B:
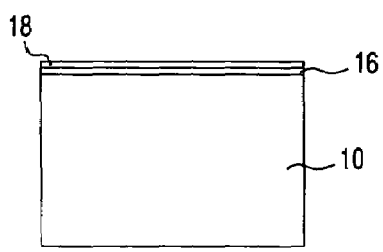
Figure 1G:
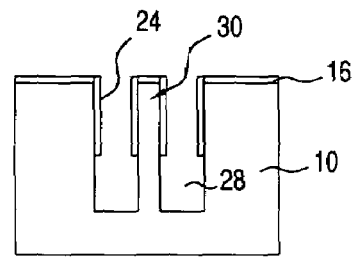
Figure 1C:
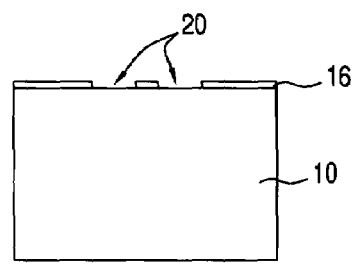

2. A sputtered $TiO_2$ layer 16 was deposited on the top surface 12 of the titanium wafer to be used as an etch mask for the titanium deep etch, as illustrated in FIG. 1(b).

3. In the next step, a photoresist layer 18 is spun on the wafer and patterned using conventional photolithography, to define a desired MEMS structure.

4. The oxide 16 is patterned and etched in a mixture of $CHF_3$ and $O_2$ to produce the pattern 20 illustrated in FIG. 1(c). In the example, the surface oxide was etched in a Materials Research Corporation RIE-51 parallel plate etch chamber. The etch was designed to give straight sidewalls in the oxide and to not etch the titanium.

5. The titanium wafer 10 is deep etched using Metal Anisotropic Reactive Ion etching with Oxidation (MARIO) through the pattern 20 to produce the trench pattern 22 illustrated in FIG. 1(d). The MARIO process is explained below.

Figure 1H:
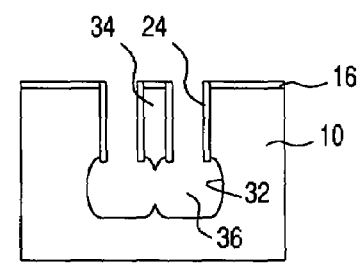

6. As illustrated in FIG. 1(e), a Plasma Enhanced Chemical Vapor Deposition (PECVD) silicon or other oxide 24 is deposited over all exposed surfaces to aid in protecting the sidewalls from further etch steps, in particular from the release etch.

7. The oxide 24 is removed from the horizontal surfaces of the wafer, and in particular from the floors 26 of the trenches 22, with another RIE oxide etch, as illustrated in FIG. 1(f). The oxide layer 24 remains on the trench walls to protect them during later titanium etches. This is a similar process step as the oxide etch above; however, the time is varied, reflecting the differing thickness of the oxide.

8. The titanium wafer 10 is further etched, as illustrated at 28 in FIG. 1(g). In this step, the floor of the titanium is lowered below the protective oxide layer 24 by etching the exposed titanium with an anisotropic chlorine etch. The illustrated trenches are spaced apart to form an island 30.

9. The walls of the titanium wafer exposed at the bottoms of the extended trenches 28 below the oxide 24, are undercut at 32, as illustrated in FIG. 1(h), using a higher-pressure chlorine plasma than in step 8 to create an isotropic etch. The undercutting is continued until the material at the bottom of island 30 is completely undercut to release the island and to form a bar or beam 34 extending over the cavity 36 formed by the isotropic etch. The beam may be patterned to remain connected to the wafer at one end, and to have a free distal end, for example, to produce a cantilevered released beam, as described in the above-referenced U.S. Pat. No. 5,316,979.

10. As illustrated in FIG. 1(i), a conductive metal 38 is deposited on the insulating layers 16 and 24 covering the titanium structure to allow voltage to be developed across the existing gaps between metal plates, completing the Ti-MEMS process.

The illustrated pattern 20, which provides two spaced trenches, is a simple example of the patterns that can be provided in accordance with the invention, with the illustrated pattern resulting, for example, in the cantilevered beam structure 40 illustrated in FIG. 2. In this structure, the beam 34 is fixed at one end to the surrounding substrate 10, and has a free end released from the substrate and extending over the floor of cavity 36 for motion with respect to the substrate. A wide range of MEMS designs are available using the foregoing process, as is known in the art. Such devices typically electrically isolate the beam structure (such as beam 34) from the overlying electrically conductive layer (such as layer 38), by way of an oxide insulator, such as layers 16 and 24, with the conductive layer then being patterned to provide capacitive plates and corresponding connections for controlling motion of the beam and/or sensing its motion. In this construction, the titanium acts only as a structural support for the conductive layer.

Figure 1D:
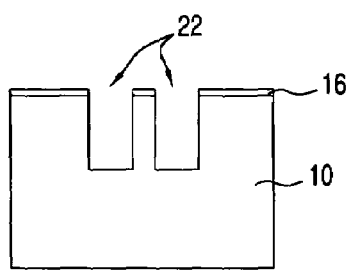
Figure 1I:
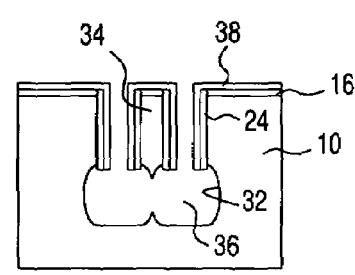
Figure 1E:
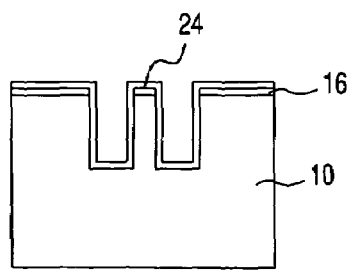

A deep etch process which is similar to the TI-MEMS process described above may be used to create cavities in the substrate by processing a wafer up to and including step 5 of FIG. 1(d). This gives the ability to create devices such as fluid channel arrays that are not released, or to enable the creation of devices that require a through wafer etch such as titanium micro tweezers or surgical tools.

In another embodiment of the process of the invention, MEMS structures are provided in which the released metal beams serve as conducting paths in the fabricated devices. This process, referred to herein as the Isolation of Metal through Oxide Deposition (IMOD) process, produces released titanium structures which serve as electrical conductors, and which are supported by oxide anchors to provide electrical isolation between the released structures and the underlaying and adjacent substrate from which they were released. This embodiment avoids the high parasitic capacitance produced by the titanium-PECVD oxide-metal composite released structure described above with respect to FIG. 1. The process also enables the creation of devices that utilize the titanium conductors as resistive heaters.

Briefly, the IMOD process is a Ti-MEMS process which defines in a Ti substrate, such as a wafer or foil, one or more released titanium beams or bars, surrounded by a cavity. The cavity is then filled with a deposited electrically insulating material which fills all of the cavity volume, including the space under the released beams. The top surface is then polished to allow further lithography steps. For a thin film, the cavity may be filled from both sides, and the resulting substrate is polished on both sides. The insulator is removed wherever an electrical contact is to be made to the beams or bars to be released. Metal is deposited to make electrical contacts, followed by an oxide deposition that will be patterned with the geometry of the future released device. The Ti-MEMS process is used again to release the titanium bars. Finally, an oxide etch is utilized to clear electrical bond pads.

The IMOD process involves 25 steps. FIGS. 3a–3h demonstrate a process flow for a generic device. In this process, a titanium wafer 50 is initially polished to a sub-micron finish, and the following steps are performed on the wafer:

A. First, oxide anchors for the titanium structure are defined, using a Ti-MEMS process such as that described in FIGS. 1(a)–1(h), and illustrated in FIGS. 3(a)–3(b):

1. An oxide mask layer 52 is deposited on the top surface of a titanium substrate 50, for use as an etch mask;
2. Standard photolithography is used to define features such as those illustrated at 54 and 56 in the photoresist;
3. The oxide layer 52 is etched to produce patterns 58 and 60 corresponding to features 54 and 56 that will eventually contain the oxide anchors;
4. The titanium 50 substrate is deep etched to form trenches 62, 64, illustrated in FIG. 3(b), using the MARIO process, with the oxide layer 52 being used as an etch mask;

5. The side walls of the trenches are passivated using a deposited oxide (PECVD $SiO_x$, for example);
6. The oxide is removed from all the trench floors, exposing the titanium substrate 50;
7. The titanium floors are etched using a single anisotropic etch which increases the depth of the etched trenches 62 and 64, allowing beams 66 and 68 to be elevated, in a manner similar to that illustrated in FIG. 1(*g*), for example; and
8. The defined beams, such as beams 66 and 68, are undercut, releasing their free ends and allowing them to be cantilevered from the substrate. These beams form the parts of the final MEMS structure which will be supported in and insulated from the substrate by oxide.

B. In the next part of the process, the cavities 62 and 64 which remain from the Ti-MEMS process are filled with an insulating material, such as $SiO_x$, as illustrated in FIGS. 3(*c*) and 3(*d*):

9. First, an oxide layer 70 is deposited over the whole substrate, filling the etched cavities 62 and 64 and extending around and under beams 62 and 64 to form oxide blocks 72 and 74, illustrated in FIG. 3(*c*).
10. The substrate is polished by a Chemical Mechanical Polish (CMP), as illustrated in FIG. 3(*d*) to achieve a flat surface 76, but leaving enough oxide on the surface to allow creation of an oxide mask.

C. The next part of the process is to define wire contact locations, illustrated in FIG. 3(*e*) for the titanium MEMS structure which is to be fabricated:

11. First, a photoresist layer is spun onto the flat surface 76, and photolithography is used to pattern the photoresist, resulting in a pattern 78 which defines the locations where a future metal deposition will make electrical contact to the released device.
12. Thereafter, the oxide layer 70 is etched using the photoresist as a mask to produce pattern 78 in the oxide;
13. The photoresist is removed;
14. A metal layer 80 for fabricating electrical conductors is deposited over the whole surface as illustrated in FIG. 3(*f*); and
15. The metal 80 is covered with a layer 82 of deposited oxide.

D. The next part of the process involves definition of contact pads and titanium released beam locations:

16. A third photolithography is performed to produce a pattern 84 which defines additional titanium bars that are to be released and the contact pads for connecting external circuitry to the conductors, as illustrated in FIG. 3(*g*);
17. The photoresist pattern 84 is transferred to the oxide layer 82;
18. The metal conductor layer 80 is etched using the photoresist/oxide mask pattern 84 and the Ti-MEMS process:
19. The oxide layer 70 is etched using the same photoresist/oxide mask pattern 84 to expose the titanium substrate 50;
20. The exposed titanium is deep etched to produce trenches 90, as illustrated in FIG. 3(*h*), defining additional beams or bars 92, 94, 96 and 98 to be released;
21. The side walls of the trenches are passivated with an oxide (PECVD $SiO_x$);
22. The floors of the trenches are cleared using an oxide etch;
23. The titanium 50 is anisotropically etched to deepen the trenches; and
24. An isotropic etch is used to undercut the additional titanium beams 92, 94, 96 and 98 to produce the released structure of FIG. 3(*h*). Alternatively, a through-wafer or through membrane release etch can be used to release the beams.

E. The last part of the process is to expose the electrical contacts:

25. Contact pads such as pad 100 are exposed using photolithography and an oxide etch.

The resulting structure, illustrated in perspective view in FIG. 3(*h*), includes released titanium beams 92, 94, 96 and 98 suspended in trench 90 from oxide blocks 72 and 74 and isolated from the titanium support which underlies metal contact layer 78. The contact layer extends to pad 100, where the metal layer may be connected to external circuitry. The metal layer 78 is connected to the released electrically conductive beams 92, 94, 96 and 98 for selective energization of these titanium beams. Blocks 72 and 74 electrically isolate the released beams from the surrounding substrate 50.

The Metal Anistropic Reactive Ion etching with Oxidation (MARIO) process mentioned above enables metal to be deep etched while maintaining feature geometry and size throughout the depth of the etch. This vertical deep etch is achieved by alternating between an oxidation plasma deposition and an etching plasma. The oxidation plasma grows a thin protective oxide on all of the exposed metal, while the etch plasma removes the oxide on the floor and etches the exposed titanium, as illustrated in FIGS. 4(*a*)–4(*f*).

The oxide is preferentially removed from the floor during the etch cycle by the physical sputtering of higher energy ions impacting the floor. This exposes the metal to the chemical etch, allowing etching to occur only on the exposed floors, as illustrated in FIG. 4(*d*). The oxide on the sidewalls is not removed because of the low energy interaction of the ions with the sidewall, allowing the oxide to remain, and preventing the sidewall from being attacked by the metal etching steps. Altering the oxidation plasma conditions can change the quality and thickness of the grown oxide, which in turn changes the amount of protection offered during the further etching steps.

The alternating oxidation and etch steps produce a metal deep etch, as illustrated in FIGS. 4(*f*) and 4(*g*). This deep etch can be used to generate substantially vertical sidewalls, as illustrated, or can generate inwardly sloping sidewalls, illustrated in FIGS. 5(*a*)–5(*d*), by altering the amount of oxidation and etching performed in each cycle. The oxidation and etching parameters can also be altered to change the surface roughness on the sidewalls. By increasing the oxidation and etch time, vertical side walls with large scallops can be obtained, whereas by decreasing the time for both steps, the size of the scallops can be decreased, allowing for control of the sidewall surface roughness.

Titanium, as an example, can be deep etched using this MARIO process. Referring now to FIGS. 4(*a*)–4(*f*), a titanium substrate 120 is provided with an oxide mask 122 having a pattern 124, illustrated in FIG. 4(*a*). An initial etch 126 using chlorine, as illustrated in FIG. 4(*b*), is followed by an oxidation step, illustrated in FIG. 4(*c*) using an $O_2$ plasma to produce an oxide layer 128 on the walls of the etched cavity 130. The chlorine etch in one process flow example used a flow rate of 45 sccm at 23 mTorr, with a power of 230 watts at 420 volts. The oxidation was run with an oxygen flow rate of 50 sccm at 30 mTorr under a power of 10 watts at 1 volt. Optimal parameter settings for vertical sidewalls in this example was a 2.5 minute chlorine etch followed by a 30 second oxygen plasma. In between the etch steps a 5 second pump down was necessary before inputting the next gasses, followed by a 5 second delay to allow the conditions in the chamber to equilibrate before igniting the plasma. This cycle was repeated, as illustrated in FIGS. 4d–4f, to produce deep trenches having substantially vertical scalloped walls 142 covered with an oxide layer 144. FIG. 4(g) is a photomicrograph of trench 140 having scalloped walls 142.

An inward sloping wall in titanium can be achieved by increasing the chlorine, etch to 15 minutes, as illustrated in FIGS. 5(a)–5(d) while maintaining a 10 second oxidation step. Between each etch step a 5 second pump down is followed by a 5 second gas flow and pressure stabilization. The titanium substrate 150 in FIG. 5(a) is provided with an oxide mask 152 incorporating a pattern 154, as previously described. The substrate is etched as indicated at 156 to produce cavities 158, and the sidewalls are oxidized as indicated in FIGS. 5(c) and 5(d). The process is repeated to produce outwardly tapered trenches 160 having scalloped walls.

Ion implantation gives the ability to convert the released titanium beams into different compounds, allowing the creation of composite structures, fully converted beams, and inverted channels. The implantation can be done using conventional implantation methods or by plasma immersion ion implantation, an alternative implantation technique.

Transforming titanium into different compounds gives the ability to have new devices created out of materials which previously could not be etched because of limited etch chemistry. This permits fabrication of sensors with tremendous chemical inertness, and high temperature robustness. This added functionality, as well as the ability to create high wear-resistant coatings, gives converted titanium compounds a competitive advantage over previous fabrication methods.

Figure 6:
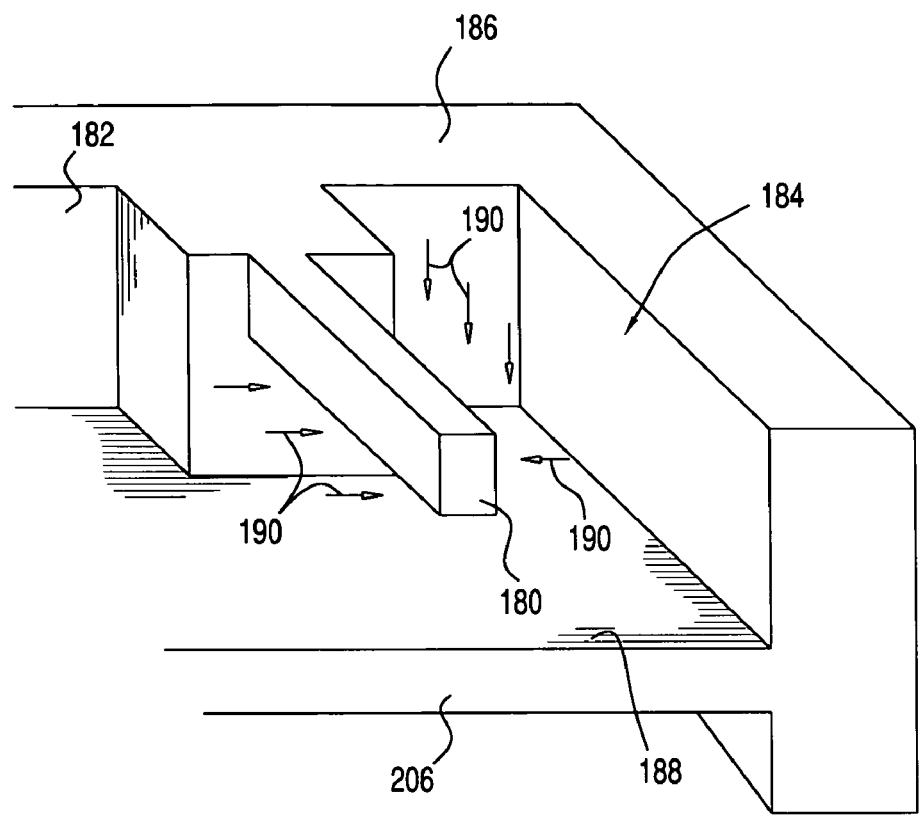
FIG. 6 illustrates ion implantation of released beams produced by the foregoing processes.

As illustrated in FIG. 6, a released titanium beam 180 is cantilevered to a wall 182 of a trench, or cavity, 184 in a titanium substrate 186, and extends into the trench over cavity floor 188 as described above. An ion implantation, indicated by arrows 190, may be used to convert part of beam 180 to form a composite material, or to convert the entire beam. For example, nitrogen ion implantation can be used to convert the metal of beam 180 to Titanium Nitride (TiN) using known ion implantation techniques. In a similar manner, the surface of the titanium beam, or the entire beam, can be converted into TiC, $TiB_2$, or like materials.

In accordance with another embodiment of the invention, pre-machined, bulk titanium or titanium alloy substrates (wafers) are used in the above-described process. Titanium-based substrates are macro-machined and polished using standard machine shop tools as well as chemical polishing processes and services to produce the starting wafer for the above-described micro-machining processes. Thus, for example, the starting wafer may have milled, drilled, or stamped features that would be very expensive or impossible to produce using semiconductor micro-processing tools and processes. In addition, such pre-machined wafers can include macroscopic milled regions to create membranes, cavities and grooves for later use in the micro-machining process, and channels can be provided for separating the individual dies (chips) at the end of the semiconductor-like, micro-machining process. The wafers can be stacked for wafer-scale packaging, and membrane structures can be made for micro-machining sensors, actuators and micro-structures. Thin (eg. 100 micrometers) membranes can be made to facilitate "through-the-membrane" releasing of MEMS, or macro-machining can be used to make large cavities to support electronic or photonic chips that interface with Ti MEMS structures fabricated on the same wafer or chip.

Figure 7:
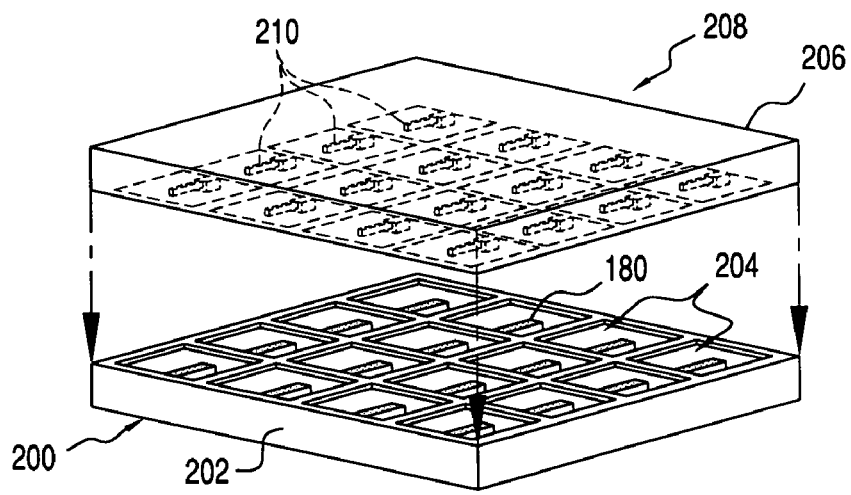
FIG. 7 is an exploded view of two metal substrates incorporating cavities containing MEMS devices, the substrates being bonded to provide an enclosed MEMS package.

Such a macro-machined wafer is illustrated at 200 in FIG. 7, wherein a titanium, 500 μm thick substrate 202 has been macro-machined from the back side to create multiple cavities 203, each defining the location of a corresponding die 204 to be fabricated on the wafer. The formation of MEMS structures such as beam 180 in cavity 184 using the above-described micromachining process on the top surface of the wafer results in each die being formed with its floor 188 being located on a thick membrane such as membrane 206, as illustrated in FIG. 6. This membrane may be on the order of 100 μm thick, for example. Thick wafers, 1 mm to 5 mm thick, can be micro-machined to form cavities for receiving ASICs, batteries, chemical fuel storage and lasers, as well as Ti MEMS devices. A second wafer 206 may then be bonded or welded to the first wafer as a cover to create a wafer-scale package or enclosure 208 as illustrated in FIG. 7. The second, or cover, wafer 206 may also incorporate multiple dies carrying Ti-MEMS devices on its bottom surface, as illustrated at 210. Either or both of the wafers may include integrated circuits such as ASIC devices, may include a battery, and will include suitable interconnects. The wafers are bonded face to face to produce a strong titanium package containing, for example interconnected MEMS devices and integrated circuits. Multiple wafers may be stacked in this manner to form a robust, highly reliable package of MEMS devices. The package can be cut apart between the cavities to make individual MEMS packages, if desired.

Figure 8:
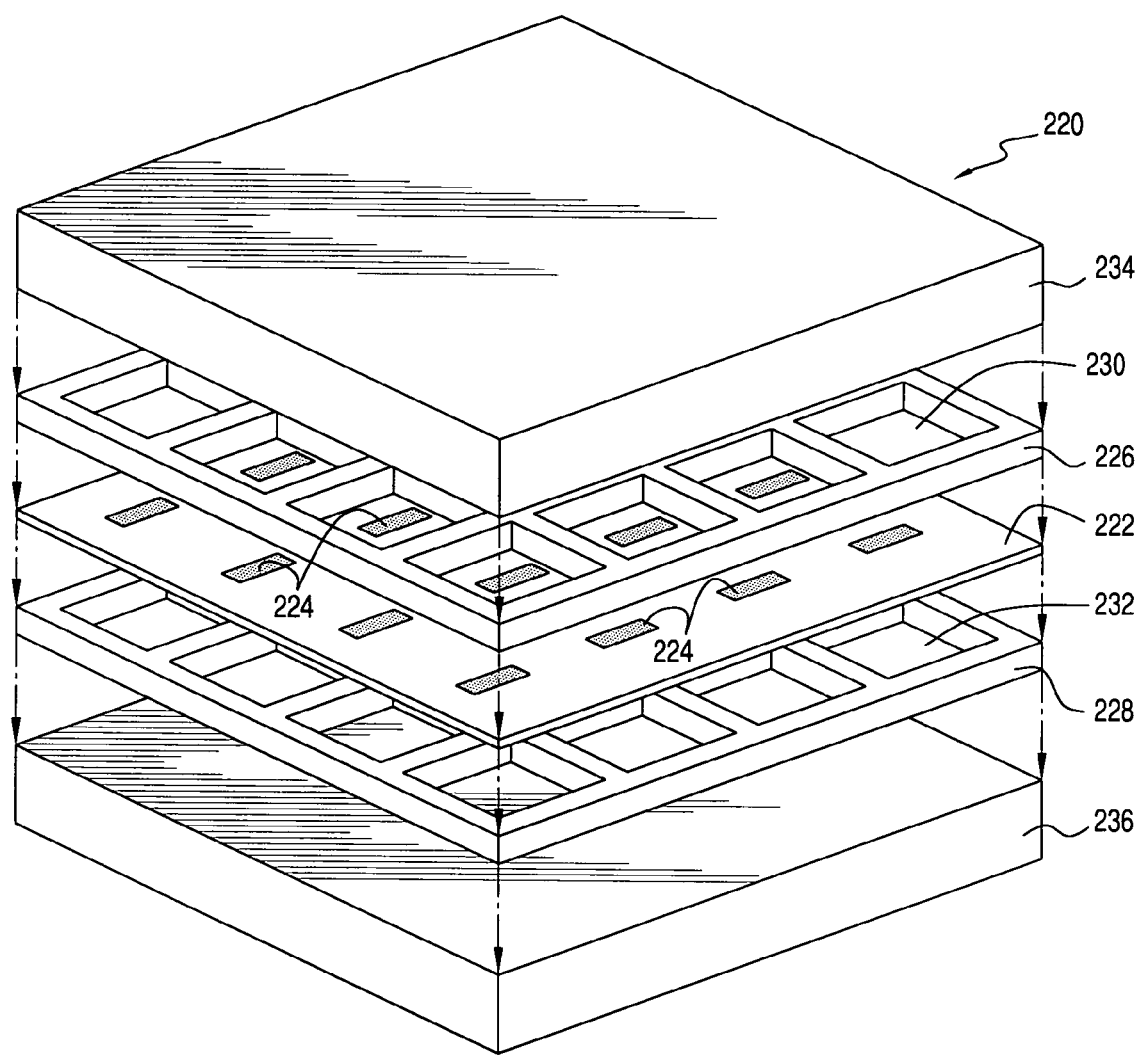
FIG. 8 is an exploded view of a MEMS package including a MEMS wafer, spacers on each side of the wafer, and top and bottom covers.

Another form of such a package is illustrated at 220 in FIG. 8, wherein a wafer 222 containing multiple dies 224 is fabricated to incorporate MEMS and/or integrated circuits in multiple cavities or pockets in the manner described above, using macro-and micro-machining processes as required to produce MEMS structures and devices in each die. The substrate wafer 222 may be a thin foil or membrane supporting multiple MEMS devices in through cavities, for example. Insulators 226 and 228 incorporating apertures 230 and 232, respectively, corresponding to the locations of the dies 224 are placed on the top and bottom of wafer 222, and covers 234 and 236 are placed on the top and bottom of the package, respectively. If desired, additional wafers and insulators may be stacked on the wafer 222 and insulator 226 to provide a package having multiple layers of wafers. The layers 226 and 228 may be electrically and/or thermally insulating, and the covers 234 and 236 preferably are a metal such a titanium to provide the desired package characteristics.

Although the MEMS structures described herein are simplified for ease of illustration, it will be understood that any desired MEMS structure may be fabricated using the processes described above. For example, and without limitation, released beam pullers, comb drive actuators and sensors, micromirrors mounted on movable beams, and like MEMS devices and structures may be fabricated on metal substrates using macro- and micro-machining.

A very substantial literature base exists for macro scale titanium processing techniques, as well as for titanium harsh environment applications including chemical processing equipment and structures; oil drilling equipment, and oil well and harsh environment sensor packaging; ocean-based structures and ships; in-vivo medical packaging; medical implants such as hips & teeth; surgical tools, and air frame structures, for titanium is the harsh environment material of choice for a very large class of such applications. The titanium-based MEMS/electronic/photonic harsh environment, sensing, communications and packaging technology described herein addresses these harsh environment applications with a package that is thermally and chemically matched to titanium structures, vehicles, ships, equipment and medical implants, helping to reduce thermal loads and galvanic corrosion.

Although the process has been described in terms of a Ti wafer as a substrate, it will be understood that thin Ti foils, or foils bonded to Ti mesh grids may be used as the substrate.

The use of titanium metal wafers allows access to their metal machining infrastructure including milling, drilling and metal polishing. It is the use and partitioning of the two machining processes—macro-machining and micro-machining—that provide new opportunities to make unique, wafer-scale, packaged macro/micro MEMS with electronic/photonic chips and power source.

Figure 9:
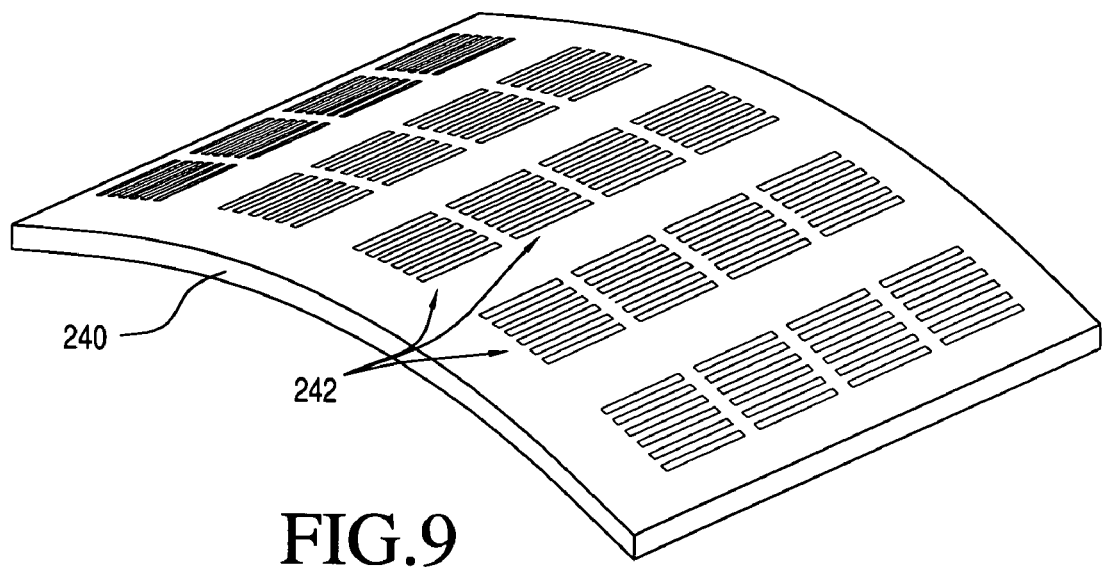
FIG. 9 illustrates MEMS devices on a flexible metal substrate.

As illustrated in FIG. 9, a wafer 240 may be fabricated from a metal substrate that is sufficiently thin to be flexible. Multiple MEMS devices 242 may be fabricated on the substrate, and later cut apart into flexible wafers or dies.

Figure 3E:
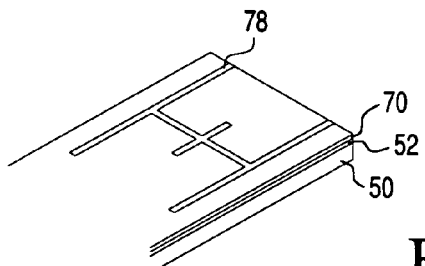
Figure 3F:
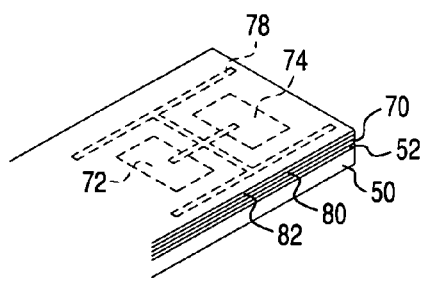
Figure 3G:
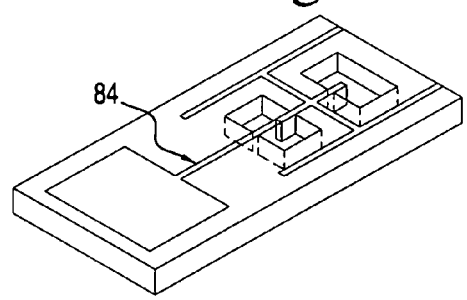
Figure 3H:
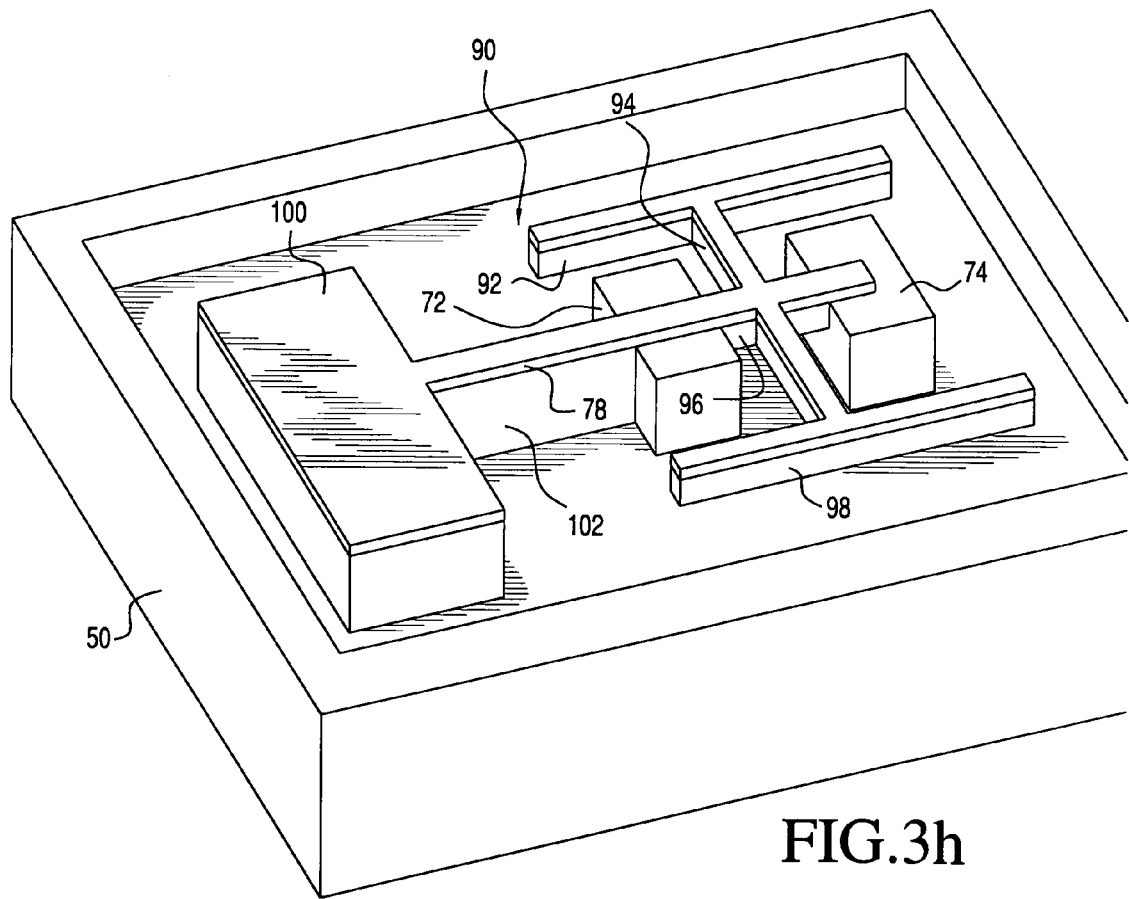
Figure 10:
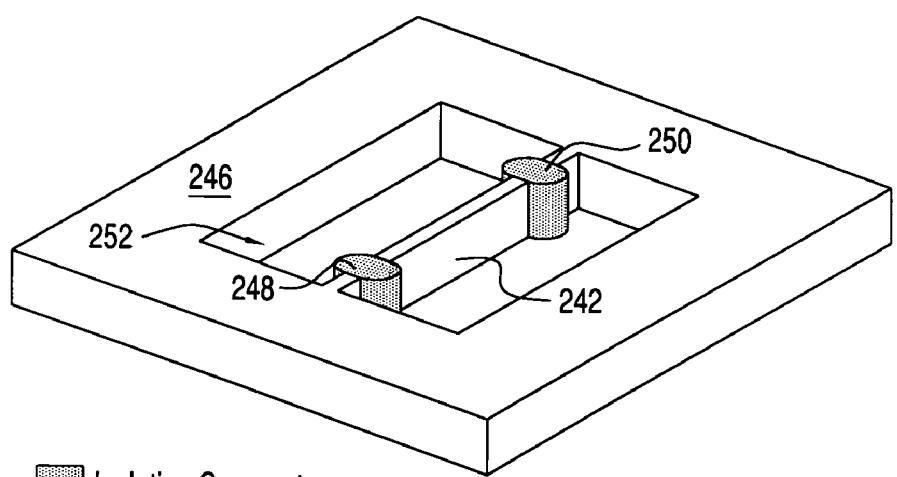
FIG. 10 illustrates an isolated released titanium segment in a through-etched device.

FIG. 10 illustrates a modification of the device of FIG. 3(h), showing a released beam supported by, and electrically isolated from, a surrounding substrate 246 by fabricating isolation segments 248 and 250 of insulating material in the beam. In the illustration, the MEMS beam 244 is supported in a through cavity 252 by the two spaced segments, to electrically isolate the released, central beam portion 244 from the surrounding metal substrate 246.

Figure 11:
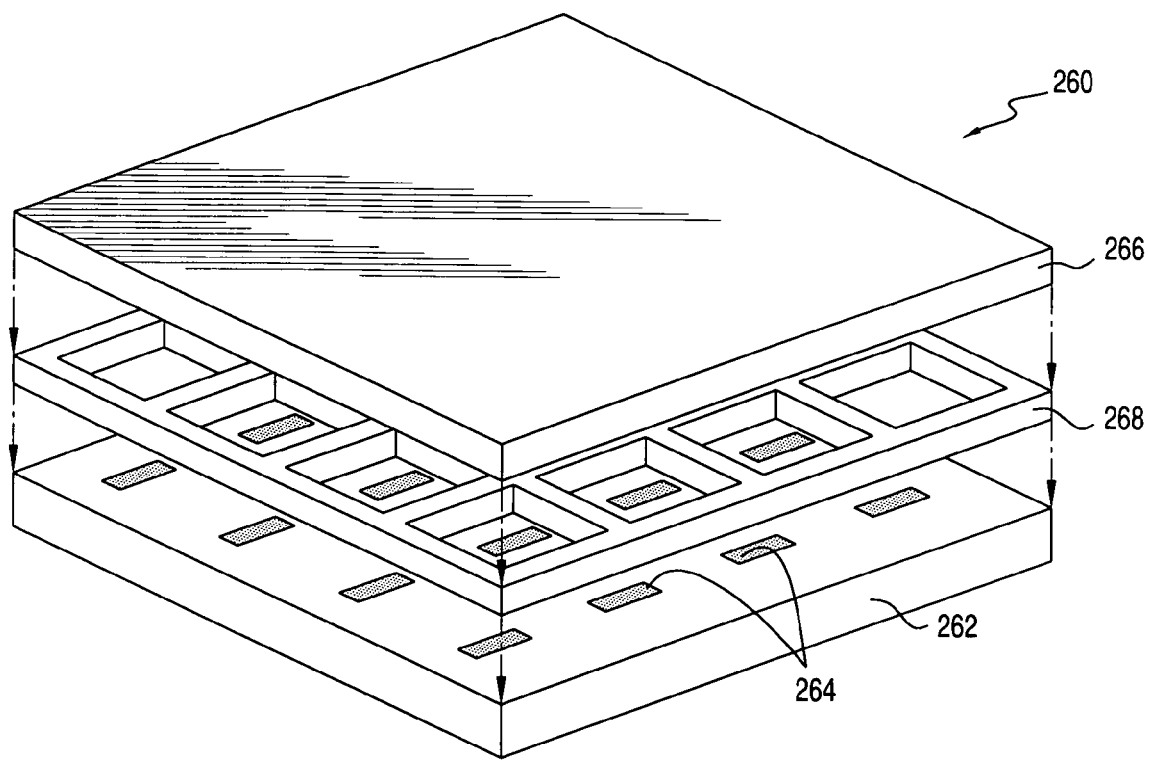
FIG. 11 is an exploded view of a MEMS package including a substrate, a spacer, and a cover.

A similar device is illustrated at 260 in FIG. 11, wherein a substrate 262 carries multiple MEMS and/or integrated circuits, etc., illustrated at 264, in a multiplicity of cavities or pockets. These cavities are encased by a cover 266 which is spaced above the substrate 262 by an open grid 268, to provide a strong metal package. The grid may be electrically and/or thermally insulating.

Titanium wafer-scale packaging using two stacked, pre-machined titanium wafers may be accomplished, for example, by providing pre-machined titanium wafers with macro alignment marks such as v grooves on the periphery of the wafers. Machined channels for die separation can be micro-machined, and the wafers aligned and bonded to form wafer-scale packaged MEMS. Separation of individual, packaged MEMS from the stacked wafers is accomplished by laser ablation or sawing through pre-machined and aligned channels, or kerfs. At die separation the MEMS are fully packaged and protected from the cutting debris.

Metals like titanium have unique properties that are most useful for applications such as sensing and packaging MEMS for medical, biological and hazardous or harsh environments. In addition, the size of the wafer is not restricted to the size of a silicon wafer; titanium substrates of square meter area can be patterned and micro-machined with presently available production equipment used to produce large area plasma and liquid crystal displays, and thin Ti foil substrates that are single or double-side polished may be used.

Titanium is an important material for applications that require high strength to weight with chemical inertness and/or Bio-compatibility. Since it may used to form three stable, high temperature compounds, it offers the potential for the development of high-aspect-ratio TiN and TiC MEMS for applications where high temperature and high hardness MEMS are required. The above-described deep RIE process (MARIO) for bulk Ti MEMS, allows fabricating structures using designs and processing techniques that have been used to make SCS MEMS. The thermally grown titanium oxide ($TiO_2$: Tm=1840° C.) or sputtered oxide can be used as an etch mask, and semiconductor-like processing and process tools are used to fabricate Ti Bulk MEMS from 200 mm diameter titanium wafers. High Aspect Ratio Bulk Ti MEMS electrical and thermal isolation structures are provided, and titanium alloys are used for specific applications requiring higher strength or resistance to chemicals. The starting wafer for micro-machining can have milled and drilled features that would be very expensive or impossible to produce using semiconductor micro-processing tools and processes. In addition, pre-machined wafers can include milled regions to create membranes and grooves or channels which can be used to separate the individual die (chips) at the end of the semiconductor-like micro-machining process or be used for making membrane structures for micro-machining sensors, actuators and microstructures in the thin membranes for through-the-membrane MEMS release-Ti SOI.

Although the invention has been described in terms of preferred embodiments, it will be understood that variations and modifications may be made without departing from the true spirit and scope of the invention, as set out in the following claims.

What is claimed is:

1. A method for fabricating microelectromechanical (MEMS) structures in a metal substrate, comprising:
   providing a mask layer on a top surface of a metal wafer;
   patterning said mask layer to form a mask defining a MEMS structure; and
   deep etching the metal wafer through said mask using metal anisotropic reactive ion etching with oxidation to provide a first cavity corresponding to said MEMS structure in said metal wafer, wherein said deep etching using metal anisotropic reactive ion etching comprises alternately and repeatedly applying an oxidation plasma and an etching plasma to said metal wafer to cyclically oxidize and etch metal exposed through said mask.

2. The method of claim 1, wherein said deep etching further includes:
   depositing PECVD oxide on all exposed floor and wall surfaces of said cavity in said metal wafer;
   removing the oxide from the floor of said cavity to expose said metal wafer; and
   further etching the exposed metal wafer.

3. The method of claim 2, further including:
   etching to undercut the exposed wall surfaces of said cavity to produce a released MEMS structure.

4. The method of claim 3, further including depositing a conductive layer on at least a portion of said mask layer.

5. The method of claim 1, wherein said patterning and deep etching steps defines a released metal MEMS structure surrounded by a cavity, the process further including:
   filling the cavity around and under the released structure with a deposited insulator;
   removing the insulating mask layer on said structure in a region where electrical contact is to be made with said structure;
   depositing metal to make contact with said structure;
   depositing a second insulating layer over said contact metal and releasing said structure.

6. The method of claim 1, further including varying said oxidation plasma to change the quality and thickness of oxidation of said metal.

7. The method of claim 1, further including varying the amount of oxidation and etching performed in each cycle to controllably etch a cavity in said metal wafer and to control the surface roughness of cavity walls.

8. The method of claim 7, further including controlling the etching of a cavity to produce a released metal structure in said metal wafer.

9. The method of claim 8, further including implanting ions in said released metal structure to change the composition of the metal.

10. The method of claim 9, wherein the metal of said metal wafer is titanium, the method further including implanting selected ions in said released metal structure to change the composition of the metal to a selected one of the group consisting of Titanium Carbide, Titanium Boride, and Titanium Nitride.

11. The method of claim 7, further including controllably etching said cavity to produce substantially vertical cavity walls.

12. The method of claim 7, further including controllably etching said cavity to produce tapered cavity walls.

13. The method of claim 1, further including stacking and bonding multiple metal substrates containing MEMS structures.

14. The method of claim 1, further including enclosing said fabricated MEMS structures to form an enclosed package.

* * * * *